US009293344B2

(12) United States Patent
Fukasawa et al.

(10) Patent No.: US 9,293,344 B2
(45) Date of Patent: Mar. 22, 2016

(54) CMP POLISHING SLURRY AND METHOD OF POLISHING SUBSTRATE

(75) Inventors: Masato Fukasawa, Hitachi (JP); Naoyuki Koyama, Hitachi (JP); Yasushi Kurata, Hitachi (JP); Kouji Haga, Hitachi (JP); Toshiaki Akutsu, Hitachi (JP); Yuuto Ootsuki, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 1473 days.

(21) Appl. No.: 11/572,523

(22) PCT Filed: Jul. 20, 2005

(86) PCT No.: PCT/JP2005/013283
§ 371 (c)(1),
(2), (4) Date: Jan. 23, 2007

(87) PCT Pub. No.: WO2006/009160
PCT Pub. Date: Jan. 26, 2006

(65) Prior Publication Data
US 2008/0003925 A1   Jan. 3, 2008

(30) Foreign Application Priority Data

Jul. 23, 2004   (JP) ............... 2004-2160309

(51) Int. Cl.
| *C09K 13/00* | (2006.01) |
| *B24B 1/00* | (2006.01) |
| *H01L 21/3105* | (2006.01) |
| *C09G 1/02* | (2006.01) |
| *C09K 3/14* | (2006.01) |

(52) U.S. Cl.
CPC ............ *H01L 21/31053* (2013.01); *C09G 1/02* (2013.01); *C09K 3/1463* (2013.01)

(58) Field of Classification Search
CPC ................................ C09K 13/00; B24B 1/00
USPC .......................... 106/3; 451/37, 41; 252/79.1; 51/307–309; 526/317.1
See application file for complete search history.

(56) References Cited

U.S. PATENT DOCUMENTS

| 5,889,105 | A * | 3/1999 | Satsuma et al. ............. 524/560 |
| 6,348,076 | B1 | 2/2002 | Canaperi et al. |
| 6,375,545 | B1 | 4/2002 | Yano et al. |
| 6,423,125 | B1 * | 7/2002 | Ishibashi et al. ............ 106/3 |
| 6,440,856 | B1 | 8/2002 | Bessho et al. |
| 6,454,819 | B1 | 9/2002 | Yano et al. |
| 6,632,259 | B2 | 10/2003 | Weinstein et al. |
| 6,638,143 | B2 | 10/2003 | Wang et al. |
| 6,783,434 | B1 | 8/2004 | Akahori et al. |
| 6,786,944 | B2 | 9/2004 | Hattori et al. |
| 6,786,945 | B2 | 9/2004 | Machii et al. |
| 6,824,578 | B2 | 11/2004 | Uchino et al. |
| 2002/0077035 | A1 | 6/2002 | Wang et al. |
| 2004/0010978 | A1 | 1/2004 | Uchino et al. |
| 2004/0235396 | A1 * | 11/2004 | Hattori et al. ............ 451/41 |

FOREIGN PATENT DOCUMENTS

| CN | 1453328 | A | 11/2003 |
| CN | 1457506 | A | 11/2003 |
| EP | 0 661 302 | B1 | 9/1999 |
| JP | 8-22970 | A | 1/1996 |
| JP | 10-106994 | A | 4/1998 |
| JP | 10-231473 | A | 9/1998 |
| JP | 2000-315667 | A | 11/2000 |
| JP | 2000-323444 | A | 11/2000 |
| JP | 2001-7059 | A | 1/2001 |
| JP | 2001-7061 | A | 1/2001 |
| JP | 2001-064631 | A | 3/2001 |
| JP | 2001-064681 | A | 3/2001 |
| JP | 2001-064685 | A | 3/2001 |
| JP | 2001-064688 | A | 3/2001 |
| JP | 2001-107089 | A | 4/2001 |
| JP | 2001226666 | A | 8/2001 |
| JP | 2001-300285 | A | 10/2001 |
| JP | 2001311073 | A | 11/2001 |
| JP | 2002-353175 | A | 12/2002 |
| JP | 2003-17446 | A | 1/2003 |
| JP | 2003-303791 | A | 10/2003 |
| JP | 2003-303792 | A | 10/2003 |
| JP | 2003-347247 | | * 12/2003 | ............ H01L 21/304 |

(Continued)

OTHER PUBLICATIONS

Translation of JP2003-347247A Koyama et al. (Dec. 2003).*
Torajiro Honma et al.; "Effect of Various Factors on Grinding Using Jet Mill", Chemical Engineering Paper Collection, vol. 6, No. 5, 1980, pp. 527-532. (English abstract). [no month].
International Search Report of PCT/JP2005/013283, date of mailing: Nov. 1, 2005.
Japanese Office Action dated Jun. 9, 2009 (dispatch date), issued in corresponding Japanese Patent Application No. 2005-504769.
Japanese Office Action dated Aug. 5, 2008 (mailing date), issued in corresponding Japanese Patent Application No. 2005-504769.

(Continued)

*Primary Examiner* — Pegah Parvini
(74) *Attorney, Agent, or Firm* — Westerman, Hattori, Daniels & Adrian, LLP

(57) ABSTRACT

The present invention relates to a CMP polishing slurry comprising cerium oxide particles, a dispersant, a water-soluble polymer and water, wherein the water-soluble polymer is a polymer obtained in polymerization of a monomer containing at least one of a carboxylic acid having an unsaturated double bond and the salt thereof by using at least one of a cationic azo compound and the salt thereof as a polymerization initiator. The present invention provides a polishing slurry and a polishing method allowing polishing efficiently uniformly at high speed without scratch and also allowing easy process management in the CMP technology of smoothening an interlayer dielectric film, BPSG film, and insulation film for shallow trench isolation.

16 Claims, No Drawings

(56) References Cited

FOREIGN PATENT DOCUMENTS

| JP | 2003-347247 A | 12/2003 |
| WO | 0039843 A1 | 7/2000 |
| WO | 02/31079 A1 | 4/2002 |
| WO | WO 2004/010487 A1 | 1/2004 |
| WO | 2006/035771 A1 | 4/2006 |
| WO | 2006/035779 A1 | 4/2006 |

OTHER PUBLICATIONS

International Search Report dated May 18, 2004 for the International Application No. PCT/JP/2004/000916.
Taiwanese Office Action dated Aug. 30, 2006 (mailing date), issued in corresponding Taiwanese Patent Application No. 09520702800.
Office Action dated Jan. 4, 2008, issued in corresponding Chinese Application No. 2005800235561.
European Search Report dated Nov. 5, 2008, issued in corresponding European Patent Application No. 05766424.5.
Chinese Office Action dated May 14, 2010, issued in corresponding Chinese Patent Application No. 2005800235561 with its English language translation.
Chinese Office Action dated Nov. 4, 2010, issued in corresponding Chinese Patent Application No. 200810129238.9.
Japanese Office Action dated Nov. 16, 2010, issued in corresponding Japanese Patent Application No. 2006-529234.
Japanese Office Action dated Jul. 12, 2011, issued in corresponding Japanese Patent Application No. 2006-529234.
Chinese Office Action dated Sep. 21, 2011, issued in corresponding Chinese Patent Application No. 2005-80023556.1.
Japanese Office Action dated Jan. 22, 2013, issued in corresponding Japanese Patent Application No. 2011-031168, w/ English translation.
Office Action dated Jun. 13, 2014, issued in corresponding Chinese Patent Application No. 201110430594.6, with English Translation (14 pages).
Office Action dated Jun. 24, 2014, issued in corresponding Japanese Patent Application No. 2013-042019, with English Translation (4 pages).
Chinese Office Action dated Oct. 8, 2013, issued in Chinese Patent Application No. 201110430594.6, w/English Translation (20 pages).
Chinese Office Action dated Nov. 18, 2014, issued in Chinese Application No. 200810129238.9; w/English Translation. (33 pages).
Japanese Office Action dated Feb. 25, 2014, issued in counterpart Japanese Patent Application No. 2013-042019, w/English translation, (4 pages).
Japanese Office Action dated Feb. 12, 2014, issued in counterpart Japanese Patent Application No. 2013-15438, w/English translation, (3 pages).
The Decision of Reexamination dated Mar. 31, 2015, issued in corresponding Chinese Patent Application No. 200810129238.9 with English translation (57 pages).
European Search Report dated Nov. 23, 2015, issued in corresponding European Patent Application No. 05 766 424.5-1555.

* cited by examiner

CMP POLISHING SLURRY AND METHOD OF POLISHING SUBSTRATE

TECHNICAL FIELD

The present invention relates to a CMP polishing slurry for use in a substrate surface-smoothening step in production of semiconductor devices, in particular in steps of smoothening an interlayer dielectric and BPSG (silicon dioxide film doped with boron and phosphorus) film, forming a shallow trench isolation, and others, and a method of polishing a substrate by using the CMP polishing slurry.

BACKGROUND ART

Currently under research and development are processing methods for improvement in density and miniaturization in production of ULSI semiconductor devices. One of the methods, chemical mechanical polishing (CMP) technology is now a technology essential in production of semiconductor devices, for example, for smoothening of an interlayer dielectric, forming a shallow trench device isolation, and forming plugged and embedded metal wiring.

In conventional production of semiconductor devices, inorganic insulation film layers such as a silicon oxide insulation film are formed by methods such as plasma CVD and low-pressure CVD. Polishing slurries of fumed silica are commonly studied as a chemical mechanical polishing slurry for use in smoothening of the inorganic insulation film layer. The fumed silica polishing slurries are produced by grain growth, for example, by oxidative thermolysis of tetrachlorosilane and subsequent pH adjustment. However, such an polishing slurry still has a problem that the polishing speed is lower.

Shallow trench isolation has been used for isolation of devices in an integrated circuit in the generation of a design rule of 0.25 μm or later. In the shallow trench isolation, CMP is used for removal of excessive silicon oxide films formed on a substrate and a stopper film smaller in polishing speed is formed under the silicon oxide film for termination of polishing. For example, silicon nitride is used for the stopper film, and the difference in polishing speed between the silicon oxide film and the stopper film is preferably greater. Conventional colloidal silica-based polishing slurries have a smaller polishing speed ratio between the silicon oxide film and the stopper film at approximately 3, and thus, did not have properties practically usable for shallow trench isolation.

On the other hand, cerium oxide polishing slurries have been used as polishing slurries for glass surface such as of a photomask and lens. Cerium oxide particles are softer than silica or alumina particles, less likely to cause scratching on the polishing surface and thus, useful for finishing mirror-surface polishing. The particles also have an advantage that the polishing speed therewith is faster than that of silica polishing slurries. Recently, CMP polishing slurries for semiconductor processing, containing a high-purity cerium oxide abrasive have been used. Such methods are described, for example, in Japanese Patent Application Laid-Open No. 10-106994.

Also known is a fact that an additive is added for control of the polishing speed with a cerium oxide polishing solution and for improvement in global smoothness. Such methods are described, for example, in Japanese Patent Application Laid-Open No. 8-22970.

SUMMARY OF THE INVENTION

However, the polishing slurries containing cerium oxide still have a problem that it is not easy to perform high speed polishing while managing the polishing process. The present invention provides a polishing slurry and a polishing method allowing polishing of a silicon oxide film or the like at high speed without polishing scratch and also allowing easy process management in the CMP technology of smoothening an interlayer dielectric film, BPSG film, and insulation film for shallow trench isolation.

The present invention relates to (1) a CMP polishing slurry comprising cerium oxide particles, a dispersant, a water-soluble polymer and water, wherein the water-soluble polymer is a polymer obtained in polymerization of a monomer containing at least one of a carboxylic acid having an unsaturated double bond and the salt thereof by using at least one of a cationic azo compound and the salt thereof as a polymerization initiator.

The present invention relate to (2) the CMP polishing slurry according to (1), wherein the blending amount of the water-soluble polymer is 0.01 weight part or more and 5 weight parts or less with respect to 100 weight parts of the CMP polishing slurry.

The present invention relates to (3) the CMP polishing slurry according to (1) or (2), wherein the weight-average molecular weight of the water-soluble polymer is 200 or more and 50,000 or less.

The present invention relates to (4) the CMP polishing slurry according to any one of (1) to (3), wherein the average particle diameter of the cerium oxide particles is 1 nm or more and 400 nm or less.

The present invention relates to (5) the CMP polishing slurry according to any one of (1) to (4), wherein the blending amount of the cerium oxide particles is 0.1 weight part or more and 5 weight parts or less with respect to 100 weight parts of the CMP polishing slurry.

The present invention relates to (6) the CMP polishing slurry according to any one of (1) to (5), wherein the pH thereof is 4.5 or higher and 6.0 or lower.

The present invention relates to (7) a polishing method of substrate comprising: pressing a substrate having a film to be polished against a polishing cloth of a polishing table; and polishing the film to be polished by moving the substrate and the polishing table relatively to each other while supplying the CMP polishing slurry according to any one of (1) to (6) between the film to be polished and the polishing cloth.

The present invention provides a polishing slurry and a polishing method allowing polishing of a silicon oxide film or the like uniformly at high speed without polishing scratch and also allowing easy process management in the CMP technology of smoothening films such as an interlayer dielectric film, BPSG film, and insulation film for shallow trench isolation.

The disclosure of this application is related to the subject matter described in Japanese Patent Application No. 2004-216039 filed on Jul. 23, 2004, the disclosure of which is incorporated by reference herein.

BEST MODE OF CARRYING OUT THE INVENTION

Generally, cerium oxide is obtained by oxidation of a cerium compound such as carbonate salt, nitrate salt, sulfate salt, or oxalate salt. A cerium oxide polishing slurry for use in polishing a silicon oxide film formed by TEOS CVD or other method allows higher-speed polishing, but causes more polishing scratches, when the crystal diameter of the particle becomes greater and the crystal distortion is smaller, i.e., when the crystallinity thereof is higher. Although the method of producing cerium oxide particles for use in the present invention is not particularly limited, the crystal diameter of the cerium oxide is preferably 5 nm or more and 300 nm or less. The content of alkali metals and halogens is preferably reduced to 10 ppm or less in the cerium oxide particle because the particle is used for polishing during production of semiconductor devices.

In the present invention, cerium oxide powder can be prepared, for example, by calcination, oxidation with hydrogen peroxide, or the like. The calcining temperature is preferably 350° C. or higher and 900° C. or lower.

The cerium oxide particles prepared by the method are aggregate, and thus, preferably pulverized mechanically. The pulverization method is preferably a dry pulverization method, for example by using a jet mill, or a wet pulverization method, for example by using a planetary bead mill. The jet mill is described, for example, in Kagaku Kogaku Ronbunshu (Chemical Industrial Paper Collection), vol. 6, No. 5 (1980) pp. 527 to 532.

A method of dispersing such cerium oxide particles in water that is a main disperse medium includes, for example, a method of using homogenizer, ultrasonic dispersing machine, or wet process ball mill, aside from a method of dispersion process by using an ordinary agitator.

Further microparticulating the cerium oxide dispersed by the above method is prepared by a sedimentation classification method of leaving the cerium oxide dispersion for a long period allowing sedimentation of larger particles and withdrawing the supernatant liquid by a pump. Besides, a high pressure homogenizer may be used for collision of the cerium oxide particles in the disperse medium mutually at high pressure.

The average particle diameter of the cerium oxide particle thus prepared in the CMP polishing slurry is preferably 1 to 400 nm, more preferably 1 to 300 nm, and still more preferably 1 to 200 nm. An average particle diameter of cerium oxide particles of less than 1 nm may lead to decrease in polishing speed, while an average particle diameter of more than 400 nm may lead to more frequent scratching on the polished film. In the present invention, the average particle diameter of cerium oxide particles is the D50 value (median diameter of volumetric distribution, cumulative median value), as measured in a laser-diffraction particle size distribution analyzer.

The CMP polishing slurry according to the present invention is prepared, for example, by blending the cerium oxide particles having the properties above, a dispersant and water to disperse the particles and adding a water-soluble polymer additionally. The concentration of the cerium oxide particles is preferably in the range of 0.1 weight part or more and 5 weight parts or less, more preferably 0.2 weight part or more and 2 weight parts or less, and still more preferably 0.5 weight part or more and 1.5 weight parts or less, with respect to 100 weight parts of the CMP polishing slurry. An excessively lower concentration leads to decrease in polishing speed, while an excessively higher concentration leads to aggregation.

Examples of the dispersants for use include water-soluble anionic dispersants, water-soluble nonionic dispersants, water-soluble cationic dispersants, water-soluble amphoteric dispersants, and the like. Polymer dispersants containing an ammonium acrylate salt as the copolymerization component are also favorable. Examples thereof include ammonium polyacrylate, copolymers of acrylic amide and ammonium acrylate, and the like.

Two or more dispersants, containing at least one polymer dispersant containing an ammonium acrylate salt as the copolymerization component and at least one dispersant selected from water-soluble anionic, nonionic, cationic, and amphoteric dispersants, may be used in combination. Because the dispersant is used in abrasion during production of semiconductor devices, the content of alkali metals such as sodium and potassium ions, halogen atoms and a sulfur atom in the dispersant is preferably reduced to 10 ppm or less.

Examples of the water-soluble anionic dispersants include triethanolamine laurylsulfate, ammonium laurylsulfate, triethanolamine polyoxyethylene alkylether sulfate, special polycarboxylate polymer dispersants, and the like.

Examples of the water-soluble nonionic dispersants include polyoxyethylene laurylether, polyoxyethylene cetylether, polyoxyethylene stearylether, polyoxyethylene oleylether, polyoxyethylene higher-alcohol ether, polyoxyethylene octylphenylether, polyoxyethylene nonylphenylether, polyoxyalkylene alkylether, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbitol tetraoleate, polyethylene glycol monolaurate, polyethylene glycol monostearate, polyethylene glycol distearate, polyethylene glycol monooleate, polyoxyethylene alkylamine, polyoxyethylene hydrogenated castor oil, 2-hydroxyethyl methacrylate, alkyl alkanol amides, and the like.

Examples of the water-soluble cationic dispersants include polyvinylpyrrolidone, coconut amine acetate, stearylamine acetate, and the like.

Examples of the water-soluble amphoteric dispersants include lauryl betaine, stearyl betaine, lauryldimethylamine oxide, 2-alkyl-N-carboxymethyl-N-hydroxyethylimidazolinium betaine, and the like.

The amount of these dispersants added is preferably in the range of 0.01 weight part or more and 10 weight parts or less with respect to 100 weight parts of the cerium oxide particles, for improvement of dispersion and prevention of sedimentation of the particles in the polishing slurry and for a relation of polishing scratch and the amount of the dispersants. The molecular weight of the dispersant is preferably 100 to 50,000, more preferably 1,000 to 10,000. A dispersant having a molecular weight of less than 100 may cause decrease in the polishing speed when a silicon oxide or nitride film is polished, while a dispersant having a molecular weight of more than 50,000 may lead to increase in viscosity and deterioration in the storage stability of the CMP polishing slurry.

The water-soluble polymer according to the present invention is a polymer obtained by radical polymerization of at least one monomer of a carboxylic acid having an unsaturated double bond and the salt thereof by using at least one of a cationic azo compound and the salt thereof as a polymerization initiator, and the polymer may be a copolymer.

Examples of the carboxylic acids having an unsaturated double bond include acrylic acid, methacrylic acid, crotonic acid, vinylacetic acid, tiglic acid, 2-trifluoromethylacrylic acid, itaconic acid, fumaric acid, maleic acid, citraconic acid, mesaconic acid, gluconic acid, and the like, and these carboxylic acids may be used in combination of two or more. The salts of the carboxylic acid include ammonium, potassium, and alkylamine salts.

The polymer may be a copolymer of the carboxylic acid and/or the salt thereof with a radical polymerizable monomer such as $C_1$ to $C_{18}$ acrylic ester, $C_1$ to $C_{18}$ methacrylic ester, acrylamide, vinylalcohol, acrylonitrile, vinylpyrrolidone, or vinylpyridine.

Examples of the cationic azo compounds according to the present invention and the salts thereof include 2,2'-azobis[2-(5-methyl-2-imidazolin-2-yl)propane]hydrochloride, 2,2'- azobis[2-(2-imidazolin-2-yl)propane], 2,2'-azobis[(2-(2-imidazolin-2-yl)propane] hydrochloride, 2,2'-azobis[2-(2-imidazolin-2-yl)propane]sulfate hydrate, 2,2'-azobis[2-(3,4,5,6-tetrahydropyrimidin-2-yl)propane]hydrochloride, 2,2'-azobis{2-[1-(2-hydroxyethyl)-2-imidazolin-2-yl]propane}hydrochloride, 2,2-azobis(2-amidino propane) hydrochloride, 2,2'-azobis(2-methylpropionamidoxime), and the like. These compounds may be used in combination of two or more, and organic salts thereof such as acetate, oxalate, malonate, succinate, malate, tartarate, and citrate and inorganic salts such as phosphate, hydrobromide, hydroiodide, and hydrofluoride are also usable.

The solvent used during polymerization is not particularly limited, but, water or $C_1$ to $C_4$ alcohols such as methanol, isopropanol, propanol, and butanol are preferable, and these solvents may be used in combination.

The weight-average molecular weight of the water-soluble polymer thus obtained is preferably in the range of 200 or more and 50,000 or less, more preferably 300 or more and 20,000 or less, and most preferably 500 or more and 10,000 or less. A molecular weight of. less than 200 may lead to insufficient smoothening efficiency, while a molecular weight of more than 50,000 may lead to aggregation of cerium oxide particles. In addition, a mercapto compound-based molecular weight adjustor such as mercaptoethanol may be used. The blending amount of the water-soluble polymer according to the present invention is preferably in the range of 0.01 weight part or more and 5 weight parts or less, more preferably 0.05 weight part or more and 3 weight parts or less, and most preferably 0.1 weight part or more and 1 weight part or less, with respect to 100 weight parts of the CMP polishing slurry. An excessively smaller addition amount leads to decrease in smoothening efficiency, while an excessively large amount leads to aggregation of cerium oxide particles.

The polishing slurry according to the present invention may contain another water-soluble polymer. The another water-soluble polymer is not particularly limited, and examples thereof include polysaccharides such as alginic acid, pectin acid, carboxymethylcellulose, agar, curdlan and pullulan; polycarboxylic acids such as polyaspartic acid, polyglutamic acid, polylysine, polymalic acid, polyamide acid, polyamide acid ammonium salt, polyamide acid sodium salt and polyglyoxylic acid and the salt thereof; and vinyl polymers such as polyvinylalcohol, polyvinylpyrrolidone and polyacrolein. The weight-average molecular weight of the water-soluble polymer is preferably 500 or more, and the blending amount thereof is preferably in the range of 0.01 weight part or more and 5 weight parts or less with respect to 100 weight parts of the CMP polishing slurry.

The polishing slurry according to the present invention shows stabilized properties even when it is stored as a two-liquid CMP polishing slurry composed of a cerium oxide slurry containing cerium oxide particles, a dispersant and water and an additional solution containing a water-soluble polymer and water, and also even when it is stored as a polishing slurry previously containing the water-soluble polymer. When the polishing slurry is stored as the two-liquid polishing slurry composed of a cerium oxide slurry and an additional solution, it is possible to adjust the smoothening efficiency and the polishing speed easily by changing the blending ratio of these two liquids. During polishing with the two-liquid polishing slurry, the additional solution and the cerium oxide slurry are fed to a polishing table as they are supplied separately from different pipes and mixed immediately before a supply pipe outlet where these pipes are connected, or the additional solution is mixed with the cerium oxide slurry immediately before polishing.

The CMP polishing slurry according to the present invention is used for polishing after it is adjusted to a desirable pH. A pH adjuster for use is not particularly limited, but ammonia water or an acid component is used more favorably than alkali metals when the polishing slurry is used for semiconductor polishing. The pH may be adjusted with the ammonium salt of the water-soluble polymer previously partially neutralized with ammonia. The pH of the CMP polishing slurry is preferably 4.5 or more and 6.0 or less, more preferably 4.8 or more and 5.6 or less. An excessively low pH leads to decrease in polishing speed, while an excessively high pH leads to deterioration in smoothness.

The pH of the CMP polishing slurry according to the present invention was measured by using a pH meter (for example, Model PH81, manufactured by Yokogawa Electric Corporation) . After two-point calibration with a standard buffer solution (phthalate buffer solution, pH: 4.21 (25° C.) and a neutral phosphate buffer solution, pH: 6.86 (25° C.)), an electrode was immersed in the CMP polishing slurry, and the pH stabilized after 2 minutes or more was measured.

The polishing method according to the present invention is characterized by polishing a film to be polished by pressing a substrate having the film to be polished against a polishing cloth of a polishing table and moving the substrate and the polishing table relatively to each other while supplying the CMP polishing slurry according to the present invention to the space between the film to be polished and the polishing cloth.

Examples of the substrates include substrates for semiconductor device production, for example, substrates having an inorganic insulation layer formed on a semiconductor substrate such as a semiconductor substrate having a circuit element and a wiring pattern formed thereon and a semiconductor substrate having a circuit element formed thereon. Examples of the films to be polished include the inorganic insulation layers described above including a silicon oxide film layer, silicon nitride and silicon oxide film layers, and the like. Surface irregularity of the silicon oxide film layer is eliminated by polishing the silicon oxide or nitride film layer formed on the semiconductor substrate with the CMP polishing slurry above, and the semiconductor substrate is smoothened over the entire surface. The substrate can also be used for shallow trench isolation. For use in shallow trench isolation, the ratio of the silicon-oxide-film polishing speed to the silicon-nitride-film polishing speed, i.e., silicon-oxide-film polishing speed/silicon nitride film polishing speed, is preferably 10 or more. The difference between the silicon-oxide-film polishing speed and the silicon nitride film polishing speed is small at a ratio of less than 10, and it is difficult to stop abrasion at a predetermined position during shallow trench isolation. The polishing speed of the silicon nitride film becomes far smaller at a ratio of 10 or more, and thus, it is possible to stop abrasion easily and thus such a high ratio is more favorable for shallow trench isolation. The substrate is preferably protected from scratching during polishing for use in shallow trench isolation.

Hereinafter the polishing method will be described, by taking a semiconductor substrate having an inorganic insulation layer formed thereon as an example.

In the, polishing method according to the present invention, a general polishing machine having a holder holding a substrate formed a film to be polished such as a semiconductor substrate and having a polishing table allowing attachment of a polishing cloth (pad) equipped with a rotational frequency-adjustable motor or the like may be used as the polishing machine. For example, a polishing machine: EPO-111, manufactured by Ebara Corporation may be used. The polishing cloth may be common nonwoven fabric, expanded polyurethane, porous fluoroplastic, or the like, but is not particularly limited. The polishing cloth is preferably processed to have grooves for holding the CMP polishing slurry. The polishing condition is not particularly limited, but the rotational velocity of the polishing table is preferably lower at 200 rpm or less for prevention of separation of the semiconductor substrate, and the pressure applied to the semiconductor substrate (processing load) is preferably not larger than 100 kPa for prevention of scratching after polishing. A CMP polishing slurry is supplied continuously onto the polishing cloth, for example, by a pump during polishing. The feed rate is not particularly limited, but the surface of the polishing cloth is preferably covered with the CMP polishing slurry all the time.

The semiconductor substrate after polishing is preferably washed thoroughly with running water and dried while the water droplets remaining on the semiconductor substrate are removed, for example, with a spin drier. It is possible to eliminate surface irregularity and to make the semiconductor substrate smoothened over the entire surface by polishing the film, an inorganic insulation layer, to be polished with the polishing slurry. After the smoothened shallow trench is formed, aluminum wiring is formed on the silicon oxide insulation film layer; a silicon oxide insulation film is formed between and on the wirings by the method above; and the film is then surface-smoothened similarly by polishing with the CMP polishing slurry. It is possible to produce a semiconductor substrate having a desired number of layers by repeating the step several times.

For global smoothening of an irregular-surfaced film to be polished (silicon oxide film), convex regions thereon should be polished selectively. When the polishing slurry containing the water-soluble polymer according to the invention is used, a protection film is formed on the surface of the cerium oxide particles and the film to be polished. Thus, the film to be polished in concave regions having a smaller effective polishing load is protected, but the film to be polished on the convex regions having a greater effective polishing load is selectively eliminated by polishing. In this way, it is possible to perform global smoothening, independently of the pattern on the polishing surface. The water-soluble polymer according to the present invention, which has a polymerization initiator cationic azo compound bound to its terminal, is adsorbed electrostatically on the negatively-charged silicon oxide film in the weakly acidic to neutral range. As a result, a protection film is formed on the surface of the film to be polished uniformly and efficiently, and the wafer surface is polished uniformly.

The inorganic insulation film to which the CMP polishing slurry according to the invention is used is produced, for example, by low-pressure CVD, plasma CVD, or the like. In preparing the silicon oxide film by low-pressure CVD, monosilane $SiH_4$ is used as a Si source and oxygen $O_2$ is used as an oxygen source. The film is obtained in the $SiH_4$—$O_2$ oxidation reaction at a temperature of 400° C. or lower. The film is heat-treated as needed after CVD at a temperature of 1,000° C. or lower. When phosphorus P is doped for surface smoothening by high temperature reflow, use of a $SiH_4$—$O_2$—$PH_3$ reaction gas is preferable. The plasma CVD method has an advantage that the chemical reaction, which demands high temperature under normal thermal equilibrium, can be carried out at low temperature The plasma generation methods include two methods: a capacitively coupled method and an inductively coupled method. The reaction gases include $SiH_4$—$N_2O$ gas containing $SiH_4$ as the Si source and $N_2O$ as the oxygen source; and a TEOS-O gas (TEOS-plasma CVD method) containing tetraethoxysilane (TEOS) as the Si source. The substrate temperature is preferably 250° C. to 400° C., and the reaction pressure is preferably in the range of 67 to 400 Pa. Thus, the silicon oxide film according to the present invention may be doped with an element such as phosphorus or boron. Similarly, the silicon nitride film is formed by low-pressure CVD at a high temperature of 900° C. in the $SiH_2Cl_2$—$NH_3$ oxidation reaction, while dichlorosilane $SiH_2Cl_2$ is used as the Si source and ammonia $NH_3$ as the nitrogen source. The reaction gas used in the plasma CVD method is a $SiH_4$—$NH_3$ gas containing $SiH_4$ as the Si source and $NH_3$ as the nitrogen source. The substrate temperature is preferably 300° C. to 400° C.

The CMP polishing slurry and the polishing method according to the present invention can be applied not only to the silicon oxide film formed on a semiconductor substrate but also in the production processes for various semiconductor devices. For example, they may be used for polishing of silicon oxide films formed on a wiring board having a predetermined wiring; inorganic insulation films of glass, silicon nitride or the like; films mainly containing polysilicon, Al, Cu, Ti, TiN, W, Ta, TaN, or the like; optical glasses such as photomask, lens, and prism; inorganic conductive films such as ITO; optical integrated circuit, photoswitching element, optical waveguides made of glass or a crystalline material; an end face of an optical fiber; optical single crystals such as scintillator; solid-state laser single crystals; blue laser LED sapphire substrates; semiconductor single crystals such as SiC, GaP, and GaAs; , glass plates for magnetic disk; magnetism heads, and the like.

EXAMPLES

Example 1

(Synthesis of Water-Soluble Polymer)

960 g of deionized water was placed in a 3-liter preparative flask and heated to 90° C. while stirred under nitrogen gas atmosphere, and a solution of 497 g of acrylic acid and 53 g of 2,2'-azobis[2-(2-imidazolin-2-yl)propane] in 500 g of methanol was added into the flask over a period of 2 hours. The mixture was then kept at 90° C. for 3 hours, cooled, to give a water-soluble polymer solution. The nonvolatile matter therein was measured to be 25 weight %. The weight-average molecular weight of the polyacrylic acid thus obtained, as measured with a HPLC pump (L-7100, manufactured by Hitachi) equipped with a differential refractometer (L-3300, manufactured by Hitachi) and a GPC column (W550, manufactured by Hitachi Chemical Co., Ltd.) by using 0.3 M NaCl as a mobile phase, was 5,000 (as polyethylene glycol).

(Preparation of Cerium Oxide Particles and CMP Polishing Slurry)

40 kg of cerium carbonate hydrate was placed in an alumina container and calcined at 830° C. for 2 hours in air, to give approximately 20 kg of a yellow white powder. Phase analysis of the powder by X-ray diffraction showed that the product was cerium oxide. The diameter of the calcined powder particles was 30 to 100 μm. 15 kg of the cerium oxide particle powder was dry pulverized by use of a jet mill. After dry pulverization, the specific surface area of the polycrystalline material, as measure by the BET method, was 9 $m^2$/g.

10 kg of the cerium oxide powder and 39.875 kg of deionized water were mixed; 125 g of a commercially available aqueous ammonium polyacrylate solution (weight-average molecular weight: 8,000) (40 weight %) was added thereto; and the mixture was dispersed under ultrasonication while the mixture was stirred. The ultrasonic wave frequency was 400 kHz, and the dispersion period was 20 minutes. Then, 5 kg of the cerium oxide dispersion was placed and left in a 10-liter container, allowing sedimentation classification. After classification for 200 hours, the supernatant liquid at a height of 110 mm or more from the container bottom was withdrawn with a pump. The supernatant cerium oxide dispersion obtained was diluted with deionized water to a solid matter concentration of 5 weight %, to give a cerium oxide slurry. The slurry was diluted to a suitable concentration for measurement of the average particle diameter of the particles in the cerium oxide slurry, and the average particle diameter D50, as measured by using a laser-diffraction particle size distribution analyzer Master Sizer Microplus (trade name, manufactured by Malvern) at a refractive index of 1.93 and an absorption of 0, was 170 nm. The amount of impurity ions (Na, K, Fe, Al, Zr, Cu, Si, and Ti), as measured by an atomic absorption photometer AA-670G (manufactured by Shimadzu Corporation), was 1 ppm or less.

36 g of the aqueous polyacrylic acid solution thus prepared (25 weight %) and 2,364 g of deionized water were mixed, and the mixture was adjusted to pH 4.8 with ammonia water (25 weight %). Then, 600 g of the cerium oxide slurry (solid matter: 5 weight %) was added thereto, to give a cerium oxide CMP polishing slurry (solid matter: 1.0 weight %). The polishing slurry had a pH of 5.0. The average particle diameter D50 of the particles in the polishing slurry, as measured by a laser-diffraction particle size distribution analyzer after dilution to a suitable concentration, was 170 nm.

(Polishing of Insulation Film Layer)

A 864 wafer manufactured by SEMATECH (φ200 mm, SiN film thickness: 150 nm, $SiO_2$ film thickness: 610 nm in convex region and 610 nm in concave region) was used as a test wafer for evaluation of shallow-trench-isolation (STI) insulation film CMP. The test wafer was attached to a holder of a polishing machine (trade name: Mirra, manufactured by Applied Materials) having an adsorption pad for fixing a substrate to be held, while a porous urethane resin polishing pad IC-1000 (K groove) manufactured by Rodel was connected to a polishing table of φ480 mm. The holder was placed on the pad with its insulation film face facing downward, and the pressures of membrane, retainer ring, and inner tube were respectively set to 3.0 psi, 3.5 psi, and 3.0 psi (20.6 Pa, 24.0 Pa, and 20.6 Pa) as the processing load. The test wafer for evaluation of the STI insulation film CMP was polished while the polishing table and the wafer were moved respectively to each other at a speed of 98 rpm and 78 rpm and the CMP polishing slurry thus prepared was fed onto the polishing table dropwise at a rate of 200 milliliter/minute. The end point of polishing was determined by monitoring a torque current value of the polishing table. The wafer after polishing was washed thoroughly with purified water and then dried. The thickness of the residual insulation film in the concave and convex regions, or the residual SiN film was measured by using an optical interference thickness meter (trade name: Nanospec AFT-5100, manufactured by Nanometrics Inc.). In addition, the difference in level between the convex region and the concave region after polishing was measured by using a level difference meter Dektak V200-Si manufactured by veeco. The results are summarized in Table 1.

Example 2

(Synthesis of Water-Soluble Polymer)

960 g of deionized water was placed in a 3-liter preparative flask and heated to 90° C. while stirred under nitrogen gas atmosphere; a solution of 497 g of acrylic acid and 103 g of 2,2'-azobis(2-(2-imidazolin-2-yl)propane]bisulfate dihydrate in 500 g of deionized water was added into the flask over a period of 2 hours. The mixture was then kept at 90° C. for 3 hours, cooled to give a water-soluble polymer solution. The nonvolatile matter measured was 25 weight %. The molecular weight measurement of the water-soluble polymer obtained similarly to Example 1 revealed that the weight-average molecular weight thereof was 3,200 (as polyethylene glycol).

(Preparation of Polishing Slurry)

48 g of the aqueous polyacrylate solution thus obtained (25 weight %) and 2,352 g of deionized water were mixed, and the mixture was adjusted to pH 5.3 with ammonia water (25 weight %). Additionally, 600 g of the cerium oxide slurry (solid matter: 5 weight %) was added thereto, to give a cerium oxide-based CMP polishing slurry (solid matter: 1.0 weight %). The polishing slurry had a pH of 5.5, and the average particle diameter of the particles in the polishing slurry, as measured by a laser-diffraction particle size distribution analyzer after dilution to a suitable concentration, was 170 nm.

(Polishing of Insulation film Layer)

A test wafer for evaluation of shallow-trench-isolation (STI) insulation film CMP was polished in the same manner as in Example 1, except that the polishing slurry thus prepared was used. The results are summarized in Table 1.

Example 3

(Synthesis of Water-Soluble Polymer)

360 g of deionized water was placed in a 3-liter preparative flask and heated to 90° C. while stirred under nitrogen gas atmosphere, and a solution of 256 g of methacrylic acid, 255 g of acrylic acid and 46 g of 2,2'-azobis[2-(2-imidazolin-2-yl)propane] in 500 g of methanol was added into the flask over a period of 2 hours. The mixture was kept at 90° C. for 3 hours, cooled to give a water-soluble polymer solution. Then on volatile matter determined was 25 weight %. The molecular weight measurement of the water-soluble polymer obtained similarly to Example 1 revealed that the weight-average molecular weight thereof was 4,200 (as polyethylene glycol).

(Preparation of Polishing Slurry)

36 g of the aqueous polyacrylic acid-methacrylic acid copolymer solution obtained above (25 weight %) was mixed with 2,364 g of deionized water, and the mixture was adjusted to pH 4.9 with ammonia water (25 weight %). Additionally, 600 g of the cerium oxide slurry (solid matter: 5 weight %) was added thereto, to give a cerium oxide-based CMP polishing slurry (solid matter: 1.0 weight %). The polishing slurry had a pH of 5.1, and the average particle diameter of the particles in the polishing slurry, as measured by a laser-diffraction particle size distribution analyzer after dilution to a suitable concentration, was 170 nm.

(Polishing of Insulation Film Layer)

A test wafer for evaluation of shallow-trench-isolation (STI) insulation film CMP was polished in the same manner as in Example 1, except that the polishing slurry thus prepared was used. The results are summarized in Table 1.

Example 4

(Synthesis of Water-Soluble Polymer)

960 g of deionized water was placed in a 3-liter preparative flask and heated to 90° C. while stirred under nitrogen gas atmosphere, and a solution of 256 g of methacrylic acid, 255 g of acrylic acid and 89 g of 2,2'-azobis[2-(2-imidazolin-2-yl)propane]bisulfate dihydrate in 500 g of deionized water was added into the flask over a period of 2 hours. The mixture was kept at 90° C. for 3 hours, cooled to give a water-soluble polymer solution. The nonvolatile matter measured was 25 weight %. The molecular weight measurement of the water-soluble polymer obtained similarly to Example 1 revealed that the weight-average molecular weight was 7,500 (as polyethylene glycol).

(Preparation of Polishing Slurry)

30 g of the aqueous polyacrylic acid-methacrylic acid copolymer solution obtained above (25 weight %) was mixed with 2,370 g of deionized water, and the mixture was adjusted to pH 4.6 with ammonia water (25 weight %). Additionally, 600 g of the cerium oxide slurry (solid matter: 5 weight %) was added thereto, to give a cerium oxide-based CMP polishing slurry (solid matter: 1.0 weight %). The polishing slurry had a pH of 4.8, and the average particle diameter of the particles in the polishing slurry, as measured by a laser-diffraction particle size distribution analyzer after dilution to a suitable concentration, was 170 nm.

(Polishing of Insulation Film Layer)

A test wafer for evaluation of shallow-trench-isolation (STI) insulation film CMP was polished in the same manner as in Example 1, except that the polishing slurry thus prepared was used. The results are summarized in Table 1.

As described above, when a wafer for evaluation was polished with each of the CMP polishing slurries prepared in Examples 1 to 4, the convex region was polished completely and the SiN film was exposed in 200 seconds or less, as shown in Table 1. In addition, the difference in thickness between the films remaining in the high-density area (convex region: 100%) and the low-density area (convex region: 10%) was not more than 14 nm, suggesting uniform polishing. The level difference after polishing was 2 to 10 nm, indicating high smoothness.

Observation of the insulation film surface after polishing under an optical microscope showed no distinct polishing scratch on the sample in any Example.

Comparative Example (Synthesis of Water-Soluble Polymer)

480 g of isopropanol and 480 g of deionized water were placed in a 3-liter preparative flask and heated to 75° C. while stirred under nitrogen gas atmosphere, and a solution of 560 g of acrylic acid and 40 g of 2,2-azobisisobutylonitrile in 500 g of isopropanol was added into the flask over a period of 2 hours. The mixture was then kept at 75° C. for 3 hours, cooled to give a water-soluble polymer solution. Then on volatile matter determined was 25weight %. The weight-average molecular weight of the water-soluble polymer obtained, as measured similarly to Example 1, was 25,000 (as polyethylene glycol).

(Preparation of Polishing Slurry)

30 g of the aqueous polyacrylate solution (25 weight %) and 2,370 g of deionized water were mixed, and the mixture was adjusted to pH 6.9 with ammonia water (25 weight %). Additionally, 600 g of the cerium oxide slurry (solid matter: 5 weight %) was added thereto, to give a cerium oxide polishing slurry (solid matter: 1.0 weight %). The polishing slurry had a pH of 7.0, and the average particle diameter of the particles in the polishing slurry, as measured by using a laser-diffraction particle size distribution analyzer after dilution to a suitable concentration, was 170 nm.

(Polishing of Insulation Film Layer)

A test wafer for evaluation of shallow-trench-isolation (STI) insulation film CMP was polished in the same manner as in Example 1, except that the polishing slurry obtained was used. As a result, a period as long as 300 seconds was needed for exposure of the SiN film in the high-density area (convex region: 100%), indicating that the polishing speed is lower. On the other hand, the SiN film in the low-density area (convex region: 10%) was also polished completely, indicating the polishing proceeded unevenly according to the pattern density.

TABLE 1

| Item | | Example 1 | Example 2 | Example 3 | Example 4 | Comparative Example |
|---|---|---|---|---|---|---|
| Cerium oxide (wt. %) | | 1.0 | 1.0 | 1.0 | 1.0 | 1.0 |
| Water-soluble polymer | | Polyacrylic acid 0.3% Mw = 5,000 | Polyacrylic acid 0.4% Mw = 3,200 | Polyacrylic acid-methacrylic acid copolymer 0.3% Mw = 4,200 | Polyacrylic acid-methacrylic acid copolymer 0.25% Mw = 7,500 | Polyacrylic acid 0.25% Mw = 25,000 |
| Polymerization initiator | | 2,2'-Azobis[2-(2-imidazolin-2-yl)propane] | 2,2'-Azobis[2-(2-imidazolin-2-yl)propane]bisulfate dihydrate | 2,2'-Azobis[2-(2-imidazolin-2-yl)propane] | 2,2'-Azobis[2-(2-imidazolin-2-yl)propane]bisulfate dihydrate | 2,2'-Azobisisobutylonitrile |
| Polishing slurry pH | | 5.0 | 5.5 | 5.1 | 4.8 | 7.0 |
| Polishing period (second) | | 180 | 165 | 180 | 200 | 300 |
| Residual SiN thickness in convex region (nm) | Convex region 100% | 148 | 136 | 140 | 150 | 140 |
| | Convex region 10% | 138 | 122 | 128 | 138 | 0 |
| Residual $SiO_2$ thickness in concave region (nm) | Convex region 10% | 452 | 440 | 430 | 460 | 170 |
| Level difference (nm) | | 4 | 10 | 7 | 2 | 155 |

INDUSTRIAL APPLICABILITY

The present invention provides a polishing slurry and a polishing method allowing polishing of a silicon oxide film or the like without polishing scratch uniformly at high speed and also allowing easy process management in the CMP technology of smoothening films such as an interlayer dielectric film, BPSG film, and insulation film for shallow trench isolation.

The invention claimed is:

1. A CMP polishing slurry comprising cerium oxide particles, a dispersant, a water-soluble polymer and water,
wherein the water-soluble polymer is a polymer that has a cationic azo compound bound to its terminal,
wherein the water-soluble polymer is a polymer obtained by radical polymerization of a monomer containing at least one of a carboxylic acid having an unsaturated double bond and the salt thereof by using at least one polymerization initiator
selected from the group consisting of
2,2'-azobis[2-(5-methyl-2-imidazolin-2-yl)propane] hydrochloride,
2,2'-azobis[2-(2-imidazolin-2-yl)propane],
2,2'-azobis[2-(2-imidazolin-2-yl)propane] hydrochloride,
2,2'-azobis[2-(2-imidazolin-2-yl)propane] sulfate hydrate,
2,2'-azobis[2-(3,4,5,6-tetrahydropyrimidin-2-yl)propane] hydrochloride,
2,2'-azobis{2-[1-(2-hydroxyethyl)-2-imidazolin-2-yl]propane} hydrochloride,
2,2'-azobis(2-amidino propane) hydrochloride, and
2,2'-azobis(2-methylpropionamidoxime), and salts thereof.

2. The CMP polishing slurry according to claim 1, wherein the blending amount of the water-soluble polymer is 0.01 weight part or more and 5 weight parts or less with respect to 100 weight parts of the CMP polishing slurry.

3. The CMP polishing slurry according to claim 1, wherein the weight-average molecular weight of the water-soluble polymer is 200 or more and 50,000 or less.

4. The CMP polishing slurry according to claim 1, wherein the average particle diameter of the cerium oxide particles is 1 nm or more and 400 nm or less.

5. The CMP polishing slurry according to claim 1, wherein the blending amount of the cerium oxide particles is 0.1 weight part or more and 5 weight parts or less with respect to 100 weight parts of the CMP polishing slurry.

6. The CMP polishing slurry according to claim 1, wherein the pH thereof is 4.5 or higher and 6.0 or lower.

7. A polishing method of substrate comprising: pressing a substrate having a film to be polished against a polishing cloth of a polishing table; and polishing the film to be polished by moving the substrate and the polishing table relatively to each other while supplying the CMP polishing slurry according to claim 1 between the film to be polished and the polishing cloth.

8. The CMP polishing slurry according to claim 1, which is stored as a two-liquid CMP polishing slurry composed of a cerium oxide slurry containing the cerium oxide particles, the dispersant and water and an additional solution containing the water-soluble polymer and water.

9. A method of producing CMP polishing slurry comprising
obtaining a polymer having a cationic azo compound bound to its terminal by radical polymerization of a monomer containing at least one of a carboxylic acid having an unsaturated double bond and the salt thereof by using at least one of a cationic azo compound and the salt thereof as a polymerization initiator, and
mixing at least cerium oxide particles, a dispersant, said water-soluble polymer and water to obtain a CMP polishing slurry,
wherein the cationic azo compound and the salt thereof is at least one selected from the group consisting of
2,2'-azobis[2-(5-methyl-2-imidazolin-2-yl)propane] hydrochloride,
2,2'-azobis[2-(2-imidazolin-2-yl)propane],
2,2'-azobis[2-(2-imidazolin-2-yl)propane] hydrochloride,
2,2'-azobis[2-(2-imidazolin-2-yl)propane] sulfate hydrate,
2,2'-azobis[2-(3,4,5,6-tetrahydropyrimidin-2-yl)propane] hydrochloride,
2,2'-azobis{2-[1-(2-hydroxyethyl)-2-imidazolin-2-yl]propane} hydrochloride,
2,2'-azobis(2-amidino propane) hydrochloride, and
2,2'-azobis(2-methylpropionamidoxime).

10. The method of producing CMP polishing slurry according to claim 9, wherein the blending amount of the water-soluble polymer is 0.01 weight part or more and 5 weight parts or less with respect to 100 weight parts of the CMP polishing slurry.

11. The method of producing CMP polishing slurry according to claim 9, wherein the weight-average molecular weight of the water-soluble polymer is 200 or more and 50,000 or less.

12. The method of producing CMP polishing slurry according to claim 9, wherein the average particle diameter of the cerium oxide particles is 1 nm or more and 400 nm or less.

13. The method of producing CMP polishing slurry according to claim 9, wherein the blending amount of the cerium oxide particles is 0.1 weight part or more and 5 weight parts or less with respect to 100 weight parts of the CMP polishing slurry.

14. The method of producing CMP polishing slurry according to claim 9, wherein the pH of the CMP polishing slurry is 4.5 or higher and 6.0 or lower.

15. A polishing method of substrate comprising: pressing a substrate having a film to be polished against a polishing cloth of a polishing table; and polishing the film to be polished by moving the substrate and the polishing table relatively to each other while supplying the CMP polishing slurry made by the method of producing CMP polishing slurry according to claim 9 between the film to be polished and the polishing cloth.

16. The method of producing CMP polishing slurry according to claim 9, wherein the CMP polishing slurry is stored as a two-liquid CMP polishing slurry composed of a cerium oxide slurry containing the cerium oxide particles, the dispersant and water and an additional solution containing the water-soluble polymer and water.

* * * * *